United States Patent
Aseev et al.

(10) Patent No.: US 11,588,093 B2
(45) Date of Patent: Feb. 21, 2023

(54) FABRICATION METHOD FOR SEMICONDUCTOR NANOWIRES COUPLED TO A SUPERCONDUCTOR

(71) Applicant: Microsoft Technology Licensing, LLC, Redmond, WA (US)

(72) Inventors: Pavel Aseev, Delft (NL); Philippe Caroff-Gaonac'h, Delft (NL)

(73) Assignee: Microsoft Technology Licensing, LLC, Redmond, WA (US)

(*) Notice: Subject to any disclaimer, the term of this patent is extended or adjusted under 35 U.S.C. 154(b) by 0 days.

(21) Appl. No.: 17/597,837

(22) PCT Filed: Jul. 29, 2019

(86) PCT No.: PCT/EP2019/070388
§ 371 (c)(1),
(2) Date: Jan. 25, 2022

(87) PCT Pub. No.: WO2020/018380
PCT Pub. Date: Feb. 4, 2021

(65) Prior Publication Data
US 2022/0263008 A1    Aug. 18, 2022

(51) Int. Cl.
*H01L 39/24* (2006.01)
*H01L 29/06* (2006.01)
*H01L 21/02* (2006.01)

(52) U.S. Cl.
CPC .... *H01L 39/2403* (2013.01); *H01L 21/02603* (2013.01); *H01L 29/0676* (2013.01)

(58) Field of Classification Search
CPC ......... H01L 21/02603; H01L 21/32058; H01L 23/4988; H01L 23/53285; H01L 27/18; H01L 29/0665; H01L 29/0669; H01L 29/0673; H01L 29/437; H01L 29/66439; H01L 29/775; H01L 39/2403; H01L 39/2422
See application file for complete search history.

(56) References Cited

U.S. PATENT DOCUMENTS

| | | | | |
|---|---|---|---|---|
| 2011/0160065 A1* | 6/2011 | Aytug | .............. | C23C 28/00 428/209 |
| 2019/0363237 A1* | 11/2019 | Krogstrup | .............. | C23C 14/225 |
| 2020/0287120 A1* | 9/2020 | Pikulin | .............. | B82Y 40/00 |
| 2020/0303573 A1* | 9/2020 | Najafi | .............. | H01L 31/18 |
| 2021/0083167 A1* | 3/2021 | Jespersen | .............. | B82Y 40/00 |
| 2021/0143310 A1* | 5/2021 | Holmes | .............. | H01L 39/22 |
| 2022/0157932 A1* | 5/2022 | Jespersen | .............. | H01L 29/068 |

FOREIGN PATENT DOCUMENTS

| | | |
|---|---|---|
| JP | H0864791 A | 3/1996 |
| JP | H08340134 A | 12/1996 |
| WO | WO 2019/001753 A1 | 1/2019 |

OTHER PUBLICATIONS

International Search Report and Written Opinion dated Apr. 23, 2020, from International Patent Application No. PCT/EP2019/070388, 13 pp.

* cited by examiner

*Primary Examiner* — David C Spalla
(74) *Attorney, Agent, or Firm* — Klarquist Sparkman, LLP

(57) ABSTRACT

There is provided a method for fabricating a device. On a top surface of a substrate, a first layer of a first deposition material is formed. The first layer of the first deposition material is patterned to create a seed pattern of remaining first deposition material. Homoepitaxy is used to grow a second layer of the first deposition material on the seed pattern.

20 Claims, 6 Drawing Sheets

US 11,588,093 B2

FABRICATION METHOD FOR SEMICONDUCTOR NANOWIRES COUPLED TO A SUPERCONDUCTOR

CROSS REFERENCE TO RELATED APPLICATIONS

This is the U.S. National Stage of International Application No. PCT/EP2019/070388, filed Jul. 29, 2019, which was published in English under PCT Article 21(2), and which is incorporated by reference herein in its entirety.

TECHNICAL FIELD

This application relates to the fabrication of devices such as nanoscale structures by means of homoepitaxial growth. An example application is the fabrication of superconductor-semiconductor platforms for use in quantum computers.

BACKGROUND

Quantum computing is a class of computing in which inherently quantum mechanical phenomena, such as quantum state superposition and entanglement, are harnessed to perform certain computations far more quickly than any classical computer could ever be capable of. In a "topological" quantum computer, calculations are performed by manipulating quasiparticles—called "non-abelian anyons"—that occur in certain physical systems. Anyons have unique physical characteristics that distinguish them from both fermions and bosons. Non-abelian anyons also have unique properties with respect to abelian anyons. It is these unique properties that serve as a basis for topological quantum computing, in which information is encoded as a topological property of non-abelian anyons; specifically, the braiding of their space-time worldlines. This has certain benefits over other models of quantum computation. One key benefit is stability, as the quantum braiding is unaffected by perturbations on a scale that could cause error-inducing quantum decoherence in other types of quantum computer.

Broadly speaking, to date, two types of physical system have been considered as potential hosts of non-abelian anyons, namely "5/2 fractional quantum Hall" systems in condensed matter physics, and (more recently) semiconductor-superconductor (SE//SU) nanowires. Regarding the latter, a key advance in the field was the realization that non-abelian anyons, in the form of "Majorana zero modes" (MZMs) can be formed in semiconductor (SE) nanowires (NWs) coupled to a superconductor (SU).

One of the issues encountered in the context of SE//SU nanowires is the existence of so-called "soft gap" states. The soft gap issue has been documented in publically-available literature, and suffice it to say that these soft gap states, when present, are a source of decoherence for the MZMs. Analysis and experiments indicate that a source of the soft gap is disorder in the SE//SU interface, and there has been recent work in the field on improving the quality of the SE//SU interface with the aim of providing more stable MZMs.

SUMMARY

In conventional selective area growth (SAG) of a semiconductor on a substrate, an amorphous mask is used to define the areas of the substrate on which the semiconductor is to be grown. The SE elements are then grown via heteroepitaxial growth. The inventors of the present invention have identified that, for certain material combinations such as InSb SAG on a InP substrate, this method results in a low yield of successfully grown semiconducting elements in the locations specified by the amorphous mask. The low yield of these elements is due to the semiconducting material and the substrate material being dissimilar, so resulting in the semiconducting material having a low probability of formation on the substrate, as well as the grown material containing a high density of defects.

To increase the yield of successfully grown elements, the inventors have devised a method of fabricating SE//SU nanowires without the need for the SE, elements to be grown via heteroepitaxial growth.

According to one aspect disclosed herein there is provided a method for fabricating a device, the method comprising: forming, on a top surface of a substrate, a first layer of a first deposition material; patterning the first layer of the first deposition material to create a seed pattern of remaining first deposition material; and using homoepitaxy to grow a second layer of the first deposition material on the seed pattern.

According to a second aspect of the invention, there is provided an electrical device comprising: a substrate; a seed pattern, extruding outwards from a top surface of the substrate, comprising a first deposition material; and a second layer of the first deposition material grown on top of the seed pattern; wherein the seed pattern is formed on the substrate before the second layer is grown on the seed pattern; and wherein the second layer is grown via homoepitaxy.

BRIEF DESCRIPTION OF THE DRAWINGS

To assist understanding of the present disclosure and to show how embodiments may be put into effect, reference is made, by way of example only, to the accompanying drawings in which.

DETAILED DESCRIPTION

In the fabrication technology disclosed herein, homoepitaxy is used in order to grow a network of crystalline semiconductors on a substrate.

Though the terminology is not always used consistently in the art, for the present purposes the "wafer" will be taken herein to refer to the base layer, and the "substrate" will refer to the wafer and any additional layers which may have been added to the wafer up to that point in the fabrication process.

On another point of terminology, note that "over" or such like herein does not necessarily mean with respect to gravity, but rather is to be understood in the sense of covering the wafer (or at least part thereof) on the side being worked, i.e. the side upon which the deposition is currently being performed. In the case of the mask this means between the wafer and the source (though not necessarily in physical contact with the wafer). A reciprocal interpretation should also be given to terms such as "underlying".

Figure 1:
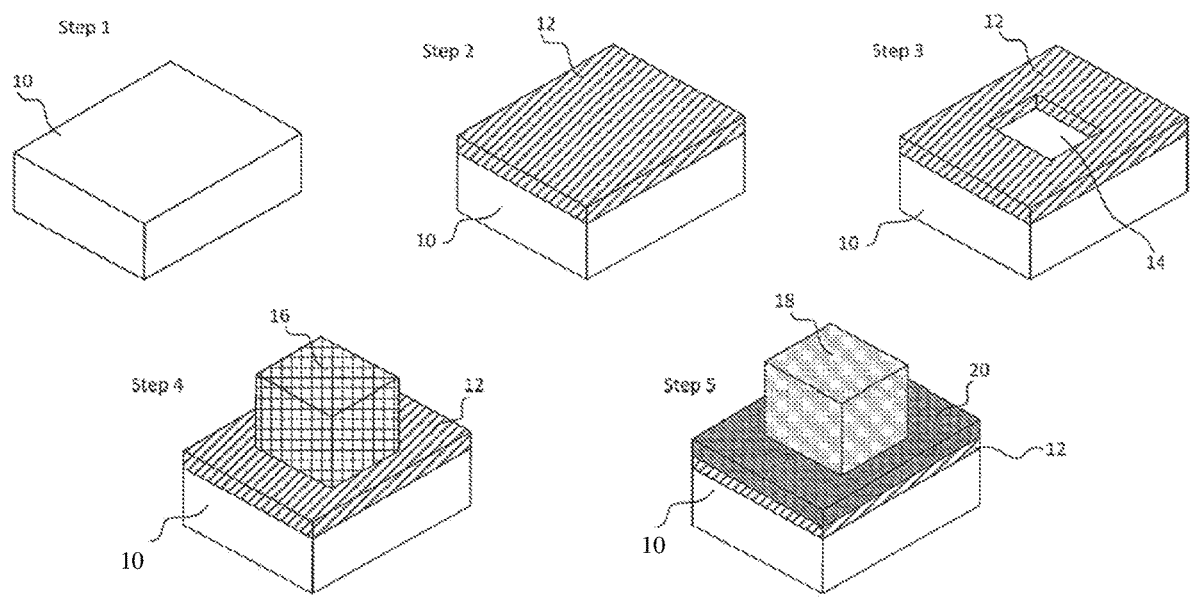
FIG. 1 shows an example of SAG via heteroepitaxy.

FIG. 1 shows an example of SAG of a semiconductor on a wafer 10 via heteroepitaxy as known in the art. Step 1 shows the blank wafer 10. The wafer 10 may, for example, be a crystalline wafer.

At step 2, a layer of amorphous masking material 12 is deposited on the top surface of the substrate 10. This amorphous masking material may be a dielectric material, for example.

At step 3, the layer of amorphous masking material 12 is patterned. The pattern produced in the layer 12 corresponds to the desired pattern of the elements to be grown via SAG. The layer 12 may be patterned using a lithographical technique, such as photolithography, or it may be etched, or it may be patterned by some other mechanical or chemical technique. The patterning process produces gaps 14 in the layer 12, corresponding to the desired growth pattern.

At step 4, the crystalline structure 16 is grown via heteroepitaxy SAG. The material used to form the crystalline structure may be a semiconductor. The crystalline structure 16 is gown in the gaps 14 of the amorphous masking material layer 12, such that it is grown on the top surface of the substrate 10 and is in electrical contact with the wafer 10.

At step 5, a layer of a superconducting material is deposited on the exposed surfaces of the substrate. That is, the top surface of the amorphous masking material layer 12 and the exposed surfaces of the crystalline structure 16. When deposited on the two different material forming the top surface of the substrate, the superconducting material takes different molecular arrangements. When deposited on the crystalline structure 16, the superconductor solidifies to form a crystalline superconductor layer 18. However, when deposited on the amorphous masking material layer 12, the superconductor solidifies to forms an amorphous or polycrystalline superconductor layer 20. The crystalline superconductor layer 18 is formed via epitaxial growth. In contract, the amorphous or polycrystalline superconductor layer 20 is formed via non-epitaxial growth.

It is desirable that the deposited SU layer on the top surface of the substrate has a high degree of crystallinity. This problem has been identified by the inventors of the present invention.

Another problem identified by the inventors is that, for certain semiconductor materials, such as InAs and InSb, there are strain induced dislocations generated when the semiconductor is grown on the wafer 10. This is due to the different lattice parameters of the two materials.

A third problem which the present invention overcomes is that the yield of the grown structures using the heteroepitaxy SAG method described above is low for certain materials, such as InSb. The yield needs to be increased in order to make the fabrication method scalable.

The yield may be defined in one of two ways, which will be explained with reference to FIG. 2.

Figure 2:
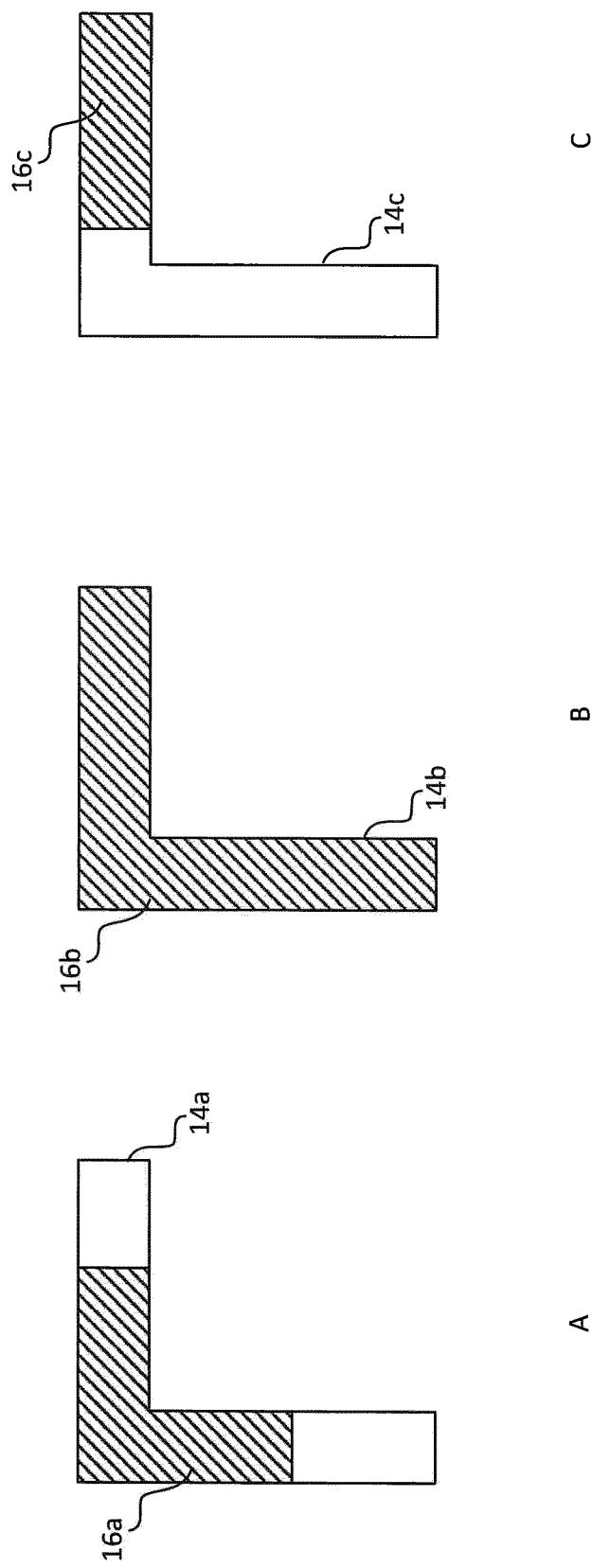
FIG. 2 illustrates three grown structures with different yields.

FIG. 2 shows three examples of gaps 14a, 14b, 14c which have been filled by grown crystalline structures 16a, 16b, 16c to different extents. In A, the total footprint of gap 14a which has been covered by the grown crystalline structure 16a is 60%; the whole footprint of gap 14b has been covered by the crystalline structure 16a in B; and only 35% of the footprint of gap 14c has been covered by the crystalline structure 16c in C.

The full footprint of the gap 14 may not be covered by the grown crystalline structure 16 due to the dissimilar characteristics of the wafer 10 and the crystalline structure 16. As explained above, this results in a low probability of formation of the crystalline structure 16 during heteroepitaxial growth. In some cases, the grown crystalline structures 16 may be too small to be usable. This may have a detrimental effect on the yield of devices, since the yield of working devices will not be higher than the yield of grown structures in cases where the entire structure is used for the device.

The first yield considered is a full structure yield. That is, the percentage of crystalline structures 16 which are complete. In the example of FIG. 2, only one of the three structures 16a, 16b, 16c is complete. That is, only one of the three crystalline structures 16a, 16b, 16c covers the whole footprint of the gap 14a, 14b, 14c in which it is formed. Thus, the full structure yield in FIG. 2 is 33%. It may be that a lower bound for the footprint of the gap 14 covered by the crystalline structure 16 which is deemed to be acceptable for use is defined. For example, it may be that a crystalline structure 16 which covers 80% of the gap 14, so 80% of the area it was designed to cover, is acceptable, and, therefore, all structures 16 which cover at least 80% of the footprint of the gaps 14 in which they are grown can contribute to the full structure yield. In some embodiments, this is only true if certain specific areas of grown networks are used for devices, and said areas are filled with SE.

The second yield considered is a covered area yield. This is the percentage of the desired covered area which is actually covered by the crystalline structures 16. In the example of FIG. 2, the total covered area is 65%.

The inventors have devised a method for overcoming the problems presented above.

Figure 3:
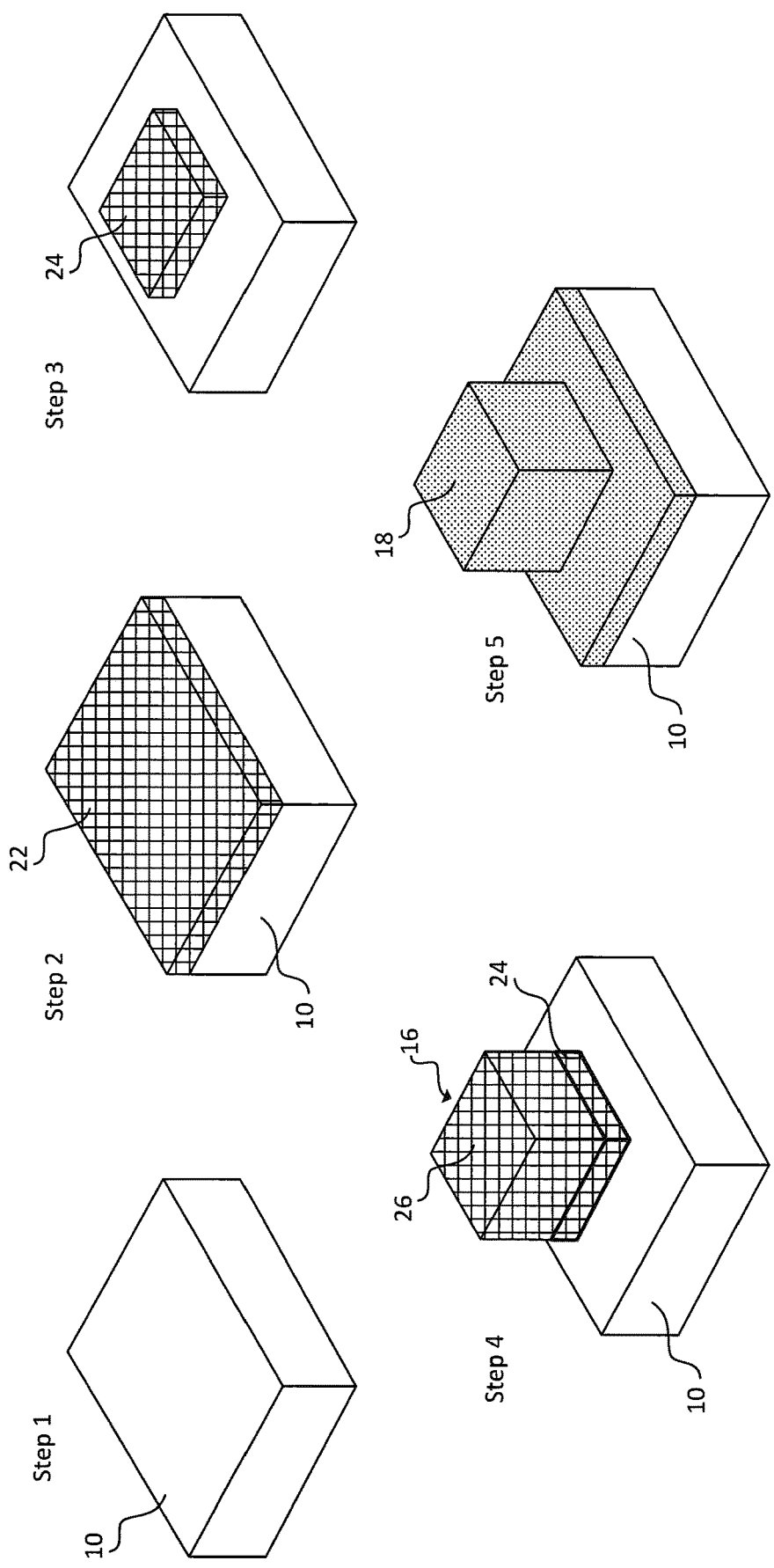
FIG. 3 shows a method for growing a structure via homoepitaxial growth.

FIG. 3 shows a schematic diagram of the method for fabricating a device proposed by the inventors. This method may be performed in a vacuum.

The method starts with a blank wafer 10. Although not shown in FIG. 3, there may also be complex layers, such as a pseudo metamorphic buffer stack, atop the wafer 10. Such stacks are known in the art and comprise layers of different materials with material properties which gradually differ from those of the wafer 10 to those of a material to be grown on top of the wafer 10. This enables a better matching of crystalline properties. The pseudo metamorphic buffer stack may be a few microns thick. In comparison, the wafer 10 may be about 0.5 mm thick. Using a complex material stack as part of the substrate at step 1, such that the substrate comprises, for example, as the wafer 10 with the pseudo metamorphic stack on top of it, can improve the quality of the final device by providing defect engineered paths.

At step 2, a first layer of a first deposition material 22 is formed over the top surface of the substrate. Here, the substrate refers to the wafer 10 and any other layers which may be on it prior to the formation of the layer of first deposition material 22, such as the pseudo metamorphic buffer stack. The first layer of first deposition material 22 is formed over the whole top surface of the substrate. The first layer 22 has substantially uniform thickness.

The first deposition material is a crystalline material. It is the same as the material which is used to form the crystalline structures 16. Therefore, it may be a semiconductor.

The first layer of first deposition material 22 may be formed in a number of ways. The method used to form this first layer 22 may depend on the properties of the substrate. For example, if the substrate comprises a crystalline wafer, the first first deposition material layer 22 may be grown via heteroepitaxy. This growth method is possible with a crystalline wafer because both the substrate and the first deposition material are crystalline.

In another embodiment, the substrate may comprise a non-crystalline wafer. Here, hetroepitaxy cannot be used. Instead, the first first deposition material layer 22 may be transferred mechanically. This method may also be used with a crystalline wafer substrate.

Other methods of forming the first layer of first deposition material 22 on the substrate may also be used. For example, chemical deposition may be used to deposit the first deposition material uniformly over the top surface of the substrate.

When using heteroepitaxy to form the first layer 22, because the first layer 22 is formed over the entire top surface of the substrate, the probability of formation tends to 1. This, therefore, increases the final yield of the structures.

At step 3, the first layer of first deposition material 22 is patterned. This results in a seed pattern 24 remaining on the top surface of the substrate. The seed pattern 24 extrudes outwards from the top surface of the substrate. The seed pattern 24 defines the areas of the substrate at which the crystalline structure 16 is to be grown.

Figure 4:
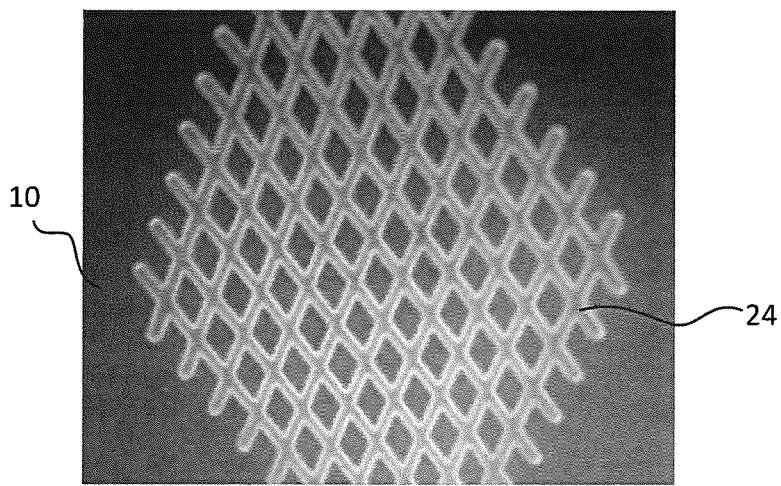
FIG. 4 shows an example of a seed pattern used for growing a structure via epitaxial growth.

FIG. 4 shows an example of the substrate after step 3. That is, the substrate comprises the wafer 10, any additional layers of the substrate of step 1 such as the pseudo metamorphic stack, and the seed pattern 24. The example of FIG. 4 shows an InSb network etched from a 60 nm thick planar layer of InSb, where InSb is the first deposition material and the planar layer is the first layer of the first deposition material 22. The width of the branches is 72.9 nm.

At step 4, a second layer of first deposition material 26 is grown on the seed pattern 24. Since these two materials are both crystalline, and, in this example, the same, homoepitaxy can be used to grow the second layer of first deposition material 26. Together, the seed pattern 24 and the second layer 26 comprise the crystalline structure 16. In some embodiments, the second layer 26 is thicker than the seed pattern 24, and so is thicker than the first layer 22, although it will be appreciated that this is not a requirement in all embodiments. The total thickness of the crystalline structure 16 may be in the order of 10s of nanometres. For example, the crystalline structure 16 may have a depth of 100 nm. The width of the crystalline structure may be of a similar order of magnitude.

It will be appreciated that the material used to form the seed pattern and the material grown on top of the seed pattern 24 may be different materials. In such an embodiment, the second layer will be grown via heteroepitaxy. These two materials may both be crystalline SE materials.

The first deposition material may be a semiconductor. The crystalline structure 16, comprising the seed pattern 24 and the second layer of the first deposition material 26, forms a nanowire. The seed pattern 24 can, therefore, be used to define the extent of the nanowires on the resultant device. Nanowires may be grown which are in the order of 10s of microns in length.

At step 5, a layer of a second deposition material 18 is formed over the top surface of the substrate. It will be appreciated that, at this step, the substrate comprises the wafer 10, any buffer layers which may be present, the seed pattern 24 and the second layer of first deposition material 26. This layer of second deposition material 18 may be grown via epitaxial growth. This is because it is grown on a crystalline material, since the top surface of the substrate is crystalline everywhere.

The second deposition material may be a superconducting material. Since all elements of the substrate which are in contact with the second deposition material layer 18 are crystalline, the layer of second deposition material 18 is also crystalline. Therefore, the problem of the reduced crystallinity of the superconducting layer in the method of FIG. 1 is overcome.

In some prior art fabrication methods, the amorphous mask layer 12 may be removed after the growth of the crystalline structures 16. That is, the mask layer 12 is removed after step 4 of FIG. 1 have been performed, but before step 5. In such a fabrication method, the layer of superconductor deposited on the surface of the substrate in step 5 would be crystalline everywhere. Although this also achieves a higher crystallinity through the deposited superconductor layer, the techniques for removing the mask layer 12 are often destructive and time- and cost-intensive. Such methods sometimes result in under-etching, for example, or result in a lower quality of resultant component. The solution proposed by the present invention for improving the crystallinity of the superconducting layer is, therefore, preferable since it does not detract from the quality of the device.

An additional benefit of the proposed solution is that both the second layer of the first deposition material 26 and the layer of second deposition material 18 may be deposited in the same chamber or connected chambers of a vacuum. Thus, the device is not exposed to air during fabrication. In the prior art, exposure to air is detrimental to the interface quality between the crystalline device 16 and the layer of second deposition material 18. As such, the fabrication method removes the degradation of the interface between these two layers and improves the resultant device quality.

The method of FIG. 3 increases the yield of the crystalline structures 16. As discussed above, this is achieved through the deposition of the first layer of the first deposition material over the entire top surface of the substrate.

In addition, the grown crystalline structures 16 themselves may be of a higher quality than those produced through the method of FIG. 1. This is due to the bulk volume of the crystalline structures being grown via homoepitaxy rather than heteroepitaxy. That is, there are fewer defects in the second layer of the first deposition material 22, thus improving the quality of the crystalline structure 16.

It will be appreciated that the term "homoepitaxy" refers to material growth under homoepitaxial growth condition. Similarly, the term "heteroepitaxy" refers to growth under heteroepitaxial growth conditions.

Heteroepitaxial growth results in a larger density of defects than homoepitaxial growth. These defects decrease the quality of the resultant crystalline structures 16. They also contribute to the lower yield when using heteroepitaxy for SAG. As such, crystalline structures 16 grown via homoepitaxy have a higher yield and contain fewer strain induced dislocations.

One example growth condition which may vary between heteroepitaxy and homoepitaxy is the temperature required for growth. Homoepitaxy be performed at a higher temperature than heteroepitaxy. For example, if the wafer 10 is InP and the first deposition material is InSb, the first layer 22 of InSb may be grown at about 400° C., whereas the second layer 26 may be grown at about 500° C. 400° C. ensures high-quality planar growth, while 500° C. allows selective area growth only on the top layer of the seed pattern 24. This is because, at higher temperatures, only the strongest chemical bonds can survive. Therefore, the probability of formation of some-on-same (e.g. InSb—InSb) bonds is higher than the weaker same-on-different (e.g. InP—InSb) bonds.

As explained above, it is not possible to grow the layer of the first deposition material on the top surface of the substrate at the temperatures used for homoepitaxy. This is the reason for there being no requirement for a mask as in the known method of FIG. 1. However, under homoepitaxy condition, it is easy to grow the second layer of the first deposition material 26 on the seed pattern 24 because they are the same material.

The first deposition material may be a semiconductor. For example, it may be InSb. Other III-V compounds may alternatively be used as the first deposition material.

Any of the above described techniques may be used to form the semiconductor in a SE//SU nanowire or nanowire network. As set out above, this SE//SU nanowire may be formed on a substrate 10 comprised of any material. The bulk semiconductor of the SE//SU nanowire may be grown via homoepitaxy, after the formation of the seed pattern 22 in the semiconductor material, as described above. The superconductor of the SE//SU nanowire may be deposited over the semiconductor after it has been grown, as shown in step 5 of FIG. 3.

Figure 6A:
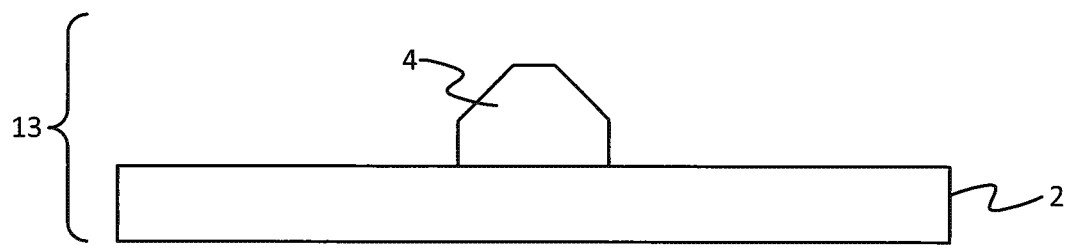
FIGS. 6a-6d are schematic diagrams of SE//SU nanowires formed on a substrate.

FIG. 6a illustrates an example device (or part thereof). The device comprises a substrate 13 comprising a wafer 2 and multiple layers formed over the wafer 2. The multiple layers comprise at least a first layer comprising structured portions of semiconductor 4. This semiconductor 4 may be the crystalline structure 16. There may, for example, be one or more intervening layers between the wafer 2 and the semiconductor 4, such as a semiconductor layer.

The portions of semiconductor 4 are formed over the wafer 2 by any suitable known deposition technique. Although not shown, there may be a coating of ferromagnetic insulator grown at least partially on each of some or all of the semiconductor portions 4. This layer may be grown by means of epitaxy.

Figure 6B:
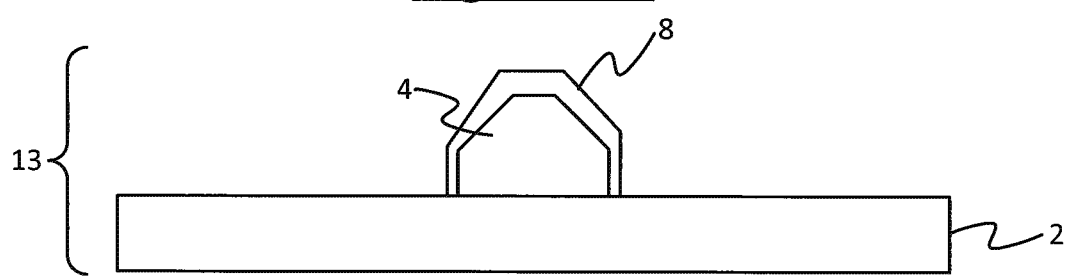

Optionally one or more further layers may be formed over semiconductor 4. FIG. 6b illustrates one example whereby an oxide layer 8 is formed over part or all of each semiconductor structure 4 (or at least some of the semiconductor structures). The oxide layers can be used to protect the semiconductor structures 4 against O2 or H2O in air. They may be used to protect samples in TEM (transmission electron microscopy) or for the reflective layer in PNR (polarized neutron reflectivity). The oxide layer 8 could be for example silicon oxide, SiOx; or more generally any dielectric or other insulating material could be used in its place. Note however that the oxide layer 8 is optional, and in other cases this protection may not be required, or could be provided by other upper layers of the substrate or IC package (not shown). In some cases, the oxide layer 8 may be used only in samples during experimentation stages, or as an intermediate step in the fabrication, but may not remain in the final product.

Figure 6C:
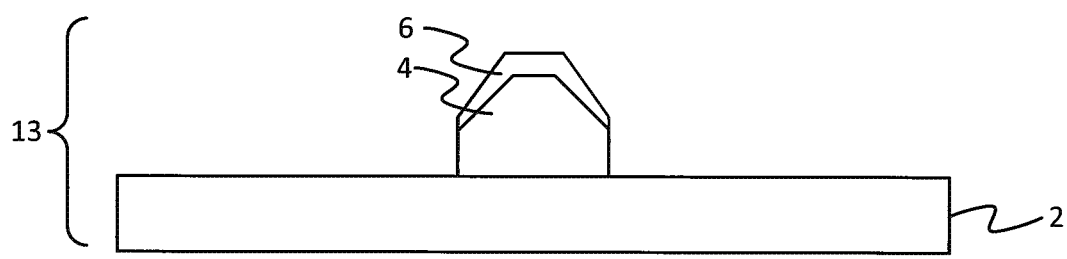

FIG. 6c illustrates an example where a coating of superconductor material 6 is formed over part or all of each semiconductor 4 (or at least some of the semiconductor 4). This superconductor 6 may be the crystalline superconductor 18. In embodiments, at least some of the semiconductor structures 4 each comprise a length or line of the semiconductor material 4. In this case FIG. 6c represents a cross section in the plane perpendicular to the line. The superconductor 6 is then formed over each such semiconductor structure 4, covering part or all of the perimeter of the line along some or all of the length of the line. Each such semiconductor structure 4 and its respective superconductor coating 6 thus forms a respective semiconductor-superconductor nanowire. A network of such nanowires may be formed over the wafer 2 and can be arranged to form a topological quantum computing device comprising one or more topological qubits. In operation, Majorana zero modes (MZMs) and hence the topological regime may be induced in parts of some or all of the nanowires by means of a magnetic field and cooling to a temperature at which the superconductor 6 exhibits superconducting behaviour. In embodiments the inducement of the MZMs and topological regime may further comprise gating with an electromagnetic potential. Structures for forming qubits and the inducement of MZMs and the topological regime in a semiconductor-superconductor nanowire are, in them themselves, known in the art.

Figure 6D:
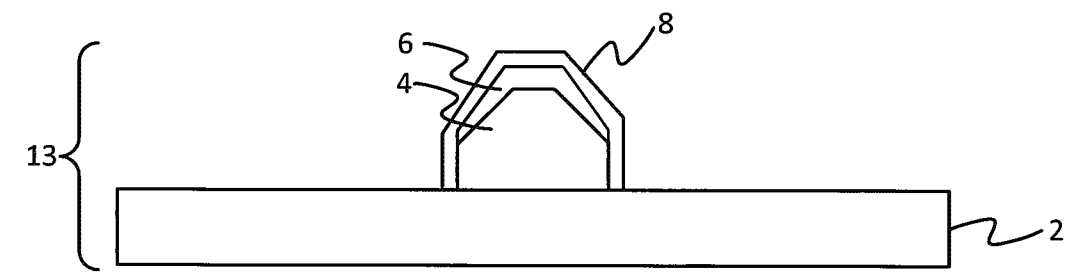

FIG. 6d illustrates an example with both the superconductor layer 6 and the oxide layer 8. The superconductor 6 may be formed on or over the semiconductor 4 of the nanowire, around some or all of the perimeter of the semiconductor 4 along some or all of its length. The oxide 8 may be formed on or over some or all of the superconductor 6, around some or all of the perimeter of the nanowire along some or all of its length.

In further examples, there could be other alternative or additional layers formed over the semiconductor 4, such as conductive vias between the semiconductors 4, and/or between the semiconductors 4 and one or more other components. As another example, an upper protective layer of plastic or wax may be formed over the whole structure.

Note that the FIGS. 6a to 6d are schematic and the shapes and dimensions shown therein are not intended to be limiting.

Figure 5:
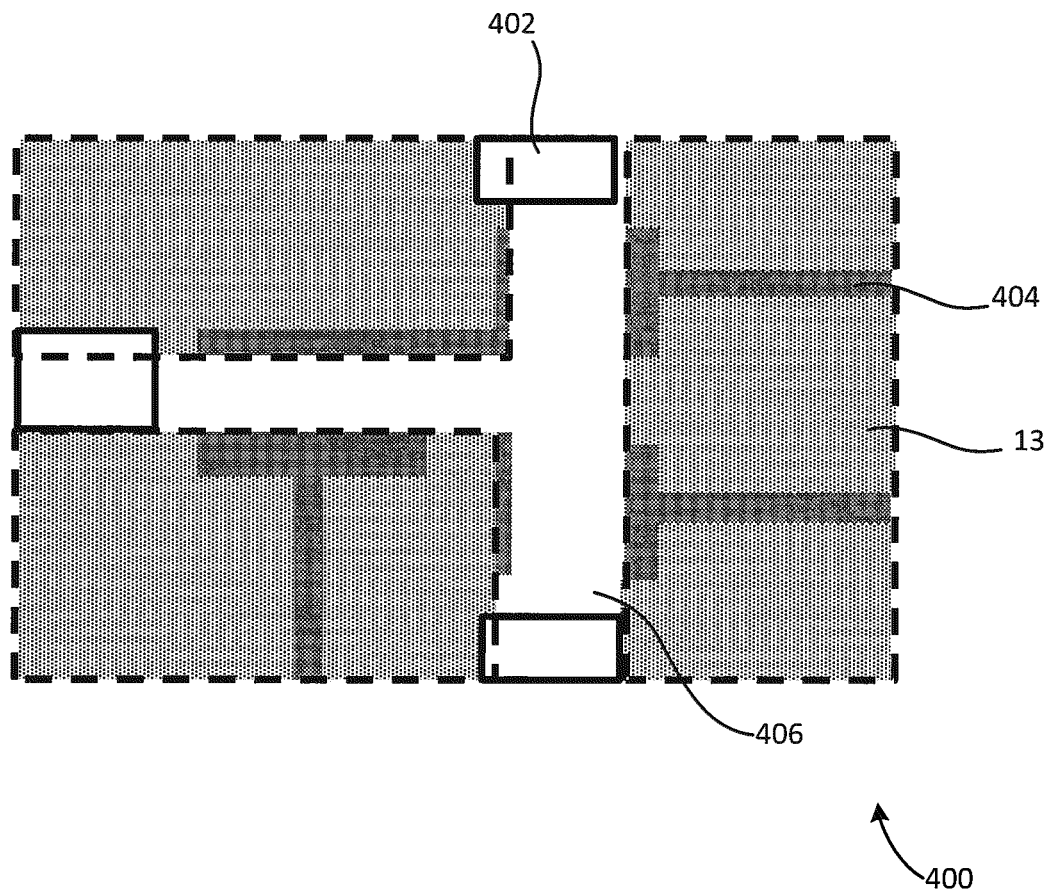
FIG. 5 shows a schematic top view of a quantum circuit comprising SE/SU nanowires and side-gate regions.

FIG. 5 shows a schematic top-view of a T-shaped SE//SU nanowire structure 406 and additional elements which form a quantum circuit 400. The SE//SU nanowires 406 are formed from lengths of semiconductor which have, at least in part, been coated with a superconductor. The disclosed method, as illustrated in FIG. 3, may be used to form the SE//SU nanowire structure 406.

Contacts 402 of the quantum circuit 400 have been added to the SE//SU nanowires, to allow electrical connection therewith. Sidegates 404 are shown which are formed of a gating material. These sideates are designed for manipulating the SE//SU nanowires, and—in the context of topological quantum computing, for example—for manipulating Majorana zero modes hosted by the SE//SU nanowires, in order to perform quantum computations.

The sidegates 404 and contacts 402 may be formed via a number of known techniques. For example, a stencil mask may be used. This is an object comprising holes which is placed in between the substrate and a source, and masks areas of the substrate which are not to be covered by the source material, such that the material is deposited in the areas defined by the holes.

Alternatively, lithography which uses a photoresist mask may be used. A patterned photo resist, i.e. a photo mask, is deposited on the substrate and then a pattern is defined by shining light (UV) through the photo resist. The illuminated areas react by changing their chemical composition. Openings are then washed out after chemically developing the resist. These openings can be used either to etch the underlying material through them or deposit subsequent materials. Thus, photoresist acts as a kind of mask. After that the photo resist is removed using solvents.

Another possible masking technique is the use of shadow masks or shadow structures. These are structures which are positioned on the substrate and used to block the path of a directional deposition beam. The structures may be transferred onto the substrate or they may be grown on the substrate. The structures may be left on the substrate after the deposition of the source material or they may be removed.

The materials for forming the elements of the quantum circuit 400 depend on the element being formed. For example, the material used may be a metal when the sidegates 404 are being formed. When the contacts 402 are being formed, the material used may be a metal or a superconductor.

FIG. 5 shows one example of a plan view of a quantum circuit 400 with one or more elements formed via the techniques described above. This example is not a limiting case, and other layouts of quantum circuits may be formed by the above method. It will be appreciated that the skilled person would know of alternative methods for making MZMs.

It will be appreciated that the above embodiments have been described by way of example only.

More generally, according to one aspect disclosed herein there is provided a method for fabricating a device, the method comprising: forming, on a top surface of a substrate, a first layer of a first deposition material; patterning the first layer of the first deposition material to create a seed pattern of remaining first deposition material; and using homoepitaxy to grow a second layer of the first deposition material on the seed pattern.

In some embodiments, the first layer of first deposition material may be formed over the whole top surface of the substrate and may have substantially uniform thickness.

In some embodiments, the second layer of first deposition material may be thicker than the first layer of first deposition material.

In some embodiments, the first deposition material may be a crystalline material.

In some embodiments, the method may comprise forming, after the second layer of first deposition material has been grown, a layer of a second deposition material over the top surface of the substrate and the second layer of first deposition material.

In some embodiments, the layer of the second deposition material may be grown via epitaxial growth.

In some embodiments, the second deposition material may be a superconducting material.

In some embodiments, at least the top surface of the substrate may comprise a different material than the first deposition material, and the first layer of the first deposition material may be formed via heteroepitaxial growth. At least the top layer of the substrate may comprise a crystalline material.

The temperature for homoepitaxial growth may be at least 10° C. higher than the temperature for heteroepitaxial growth.

In some embodiments, the first layer of first deposition material may be formed via mechanical transfer.

In some embodiments, the substrate may comprise a crystalline wafer.

In some embodiments, the substrate may comprise a pseudo metamorphic buffer stack, wherein the top surface of the substrate is the top surface of the stack.

In some embodiments, the first deposition material may be a semiconductor, and the seed pattern and second layer of the first deposition material form a nanowire or nanowire network.

In some embodiments, the method steps may be carried out in a vacuum.

According to a second aspect of the invention, there is provided an electrical device comprising: a substrate; a seed pattern, extruding outwards from a top surface of the substrate, comprising a first deposition material; and a second layer of the first deposition material grown on top of the seed pattern; wherein the seed pattern is formed on the substrate before the second layer is grown on the seed pattern; and wherein the second layer is grown via homoepitaxy.

In some embodiments, the first deposition material may be a semiconductor, and the seed pattern and second layer of first deposition material form a nanowire or nanowire network.

Other variations and applications of the disclosed techniques may become apparent to the person skilled in the art once given the disclosure herein. The scope of the present disclosure us not limited by the above-described embodiments, but only by the accompanying claims.

The invention claimed is:

1. A method for fabricating a device, comprising:
    forming, on a top surface of a substrate, a first layer of a first deposition material;
    patterning the first layer of the first deposition material to create a seed pattern of remaining first deposition material;
    using homoepitaxy to grow a second layer of the first deposition material on the seed pattern; and
    forming, after the second layer of first deposition material has been grown, a layer of a second deposition material over the top surface of the substrate and the second layer of first deposition material, wherein the second deposition material is a superconducting material.

2. The method of claim 1, wherein the first layer of first deposition material is formed over the whole top surface of the substrate and has substantially uniform thickness.

3. The method of claim 1, wherein the first deposition material is a crystalline material.

4. The method of claim 1, wherein the layer of the second deposition material is grown via epitaxial growth.

5. The method of claim 4, wherein at least the top surface of the substrate comprises a different material than the first deposition material, and the first layer of the first deposition material is formed via heteroepitaxial growth.

6. The method of claim 1, wherein at least the top surface of the substrate comprises a different material than the first deposition material, and the first layer of the first deposition material is formed via heteroepitaxial growth.

7. The method of claim 5, wherein at least the top layer of the substrate comprises a crystalline material.

8. The method of claim 6, wherein the temperature for homoepitaxial growth is at least 10° C. higher than the temperature for heteroepitaxial growth.

9. The method of claim 6, wherein the first layer of first deposition material is formed via mechanical transfer.

10. A method of claim 1, wherein the first layer of first deposition material is formed via mechanical transfer.

11. The method of claim 1, wherein the substrate comprises a crystalline wafer.

12. The method of claim 1, wherein the substrate comprises a pseudo metamorphic buffer stack, wherein the top surface of the substrate is the top surface of the stack.

13. The method of claim 5, wherein the substrate comprises a pseudo metamorphic buffer stack, wherein the top surface of the substrate is the top surface of the stack.

14. The method of claim 13, wherein the first deposition material is a semiconductor, and the seed pattern and second layer of the first deposition material form a nanowire or a nanowire network.

15. The method of claim 1, wherein the first deposition material is a semiconductor, and the seed pattern and second layer of the first deposition material form a nanowire or a nanowire network.

16. An electrical element, comprising:
    a substrate;

a seed pattern, extruding outwards from a top surface of the substrate, comprising a first deposition material;

a second layer of the first deposition material grown on top of the seed pattern; and a layer of a second deposition material over the top surface of the substrate and the second layer of first deposition material, wherein the second deposition material is a superconducting material;

wherein the seed pattern is formed on the substrate before the second layer is grown on the seed pattern;

wherein the second layer is grown via homoepitaxy; and wherein the first deposition material is a semiconductor, and the seed pattern and second layer of first deposition material form a nanowire or a nanowire network.

17. The electrical element of claim 16, wherein the substrate comprises a pseudo metamorphic buffer stack, wherein the top surface of the substrate is the top surface of the stack.

18. The electrical element of claim 16, wherein a first layer of the first deposition material is formed over the whole top surface of the substrate and has substantially uniform thickness.

19. The electrical element of claim 16, wherein the first deposition material is a crystalline material.

20. The electrical element of claim 16, wherein the substrate comprises a crystalline wafer.

\* \* \* \* \*